(12) United States Patent
Johansson et al.

(10) Patent No.: US 6,440,810 B1
(45) Date of Patent: Aug. 27, 2002

(54) METHOD IN THE FABRICATION OF A SILICON BIPOLAR TRANSISTOR

(75) Inventors: Ted Johansson, Djursholm; Hans Norström, Solna, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 5 days.

(21) Appl. No.: 09/718,423

(22) Filed: Nov. 24, 2000

(30) Foreign Application Priority Data

Nov. 26, 1999 (SE) .............................................. 9904310

(51) Int. Cl.⁷ ........................................... H01L 21/331
(52) U.S. Cl. ....................... 438/309; 438/318; 438/345
(58) Field of Search ................................ 438/189, 202, 438/203, 204, 205, 206, 207, 234, 235, FOR 186, FOR 165, FOR 166, 309–327, 331–350; 257/196–200, 163, 164, 204, 591, 557, 587, 588

(56) References Cited

U.S. PATENT DOCUMENTS

| | | | |
|---|---|---|---|
| 4,641,416 A | * 2/1987 | Iranmanesh et al. | 148/DIG. 10 |
| 4,704,785 A | 11/1987 | Curran | |
| 5,028,557 A | * 7/1991 | Tsai et al. ............... | 148/DIG. 9 |
| 5,266,504 A | 11/1993 | Blouse et al. | |
| 5,541,124 A | * 7/1996 | Miwa et al. ......... | 148/DIG. 11 |
| 5,592,017 A | * 1/1997 | Johnson ....................... | 257/197 |
| 5,593,905 A | 1/1997 | Johanson et al. | |
| 5,600,177 A | * 2/1997 | Yamazaki .................... | 257/413 |
| 5,643,805 A | * 7/1997 | Ohta et al. ............ | 148/DIG. 10 |
| 5,648,279 A | * 7/1997 | Imai ..................... | 148/DIG. 10 |
| 5,665,615 A | * 9/1997 | Anmo ......................... | 257/370 |
| 5,668,022 A | * 9/1997 | Cho et al. ............. | 148/DIG. 72 |
| 5,866,462 A | * 2/1999 | Tsai et al. ................... | 438/309 |
| 5,943,564 A | * 8/1999 | Chen et al. .................. | 438/202 |
| 6,028,345 A | * 2/2000 | Johnson ....................... | 257/557 |
| 6,117,744 A | * 9/2000 | Ammo ......................... | 438/309 |
| 6,156,595 A | * 12/2000 | Sawada ....................... | 438/202 |
| 6,248,650 B1 | * 6/2001 | Johnson ....................... | 435/365 |
| 6,319,786 B1 | * 11/2001 | Gris ............................ | 438/341 |

FOREIGN PATENT DOCUMENTS

| | | |
|---|---|---|
| JP | 1181466 | 7/1989 |
| WO | WO97/19465 | 5/1997 |

* cited by examiner

*Primary Examiner*—Trung Dang
*Assistant Examiner*—Brook Kebede
(74) *Attorney, Agent, or Firm*—Burns, Doane, Swecker & Mathis, L.L.P.

(57) ABSTRACT

In the fabrication of a silicon bipolar transistor, a method for forming base regions and for opening an emitter window is provided. A silicon substrate is provided with suitable device isolation. A first base region is formed in or on top of the substrate. A thin layer of oxide is formed on the first base region. A layer of silicon is formed on top of the thin oxide layer, the silicon layer is to be a second base region. The silicon layer is ion implanted. A layer of a dielectric is formed on top of the silicon layer, the dielectric is to isolate base and emitter regions of the transistor. The obtained structure is patterned in order to define the emitter window. The structure inside the defined emitter window area is etched and through the dielectric and silicon layers, wherein the thin oxide layer is used as etch stop, thus forming the emitter window. The structure is subsequently heat treated and thus break up the oxide such that the first and second base regions will contact each other.

29 Claims, 3 Drawing Sheets

METHOD IN THE FABRICATION OF A SILICON BIPOLAR TRANSISTOR

TECHNICAL FIELD

Figure 1:
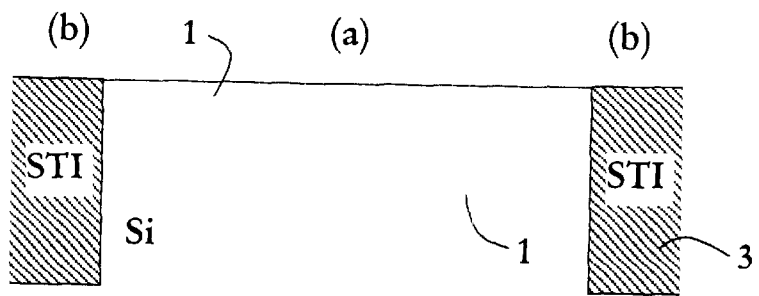
Figure 2:
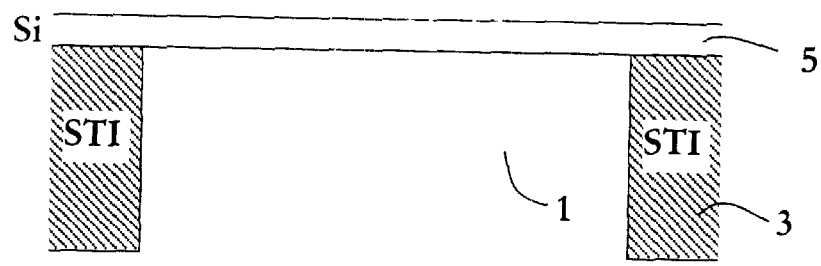
Figure 3:
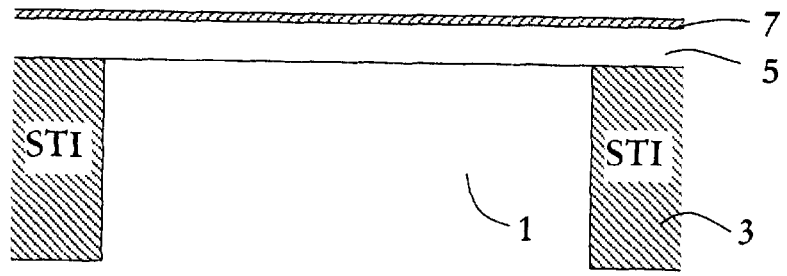
Figure 4:
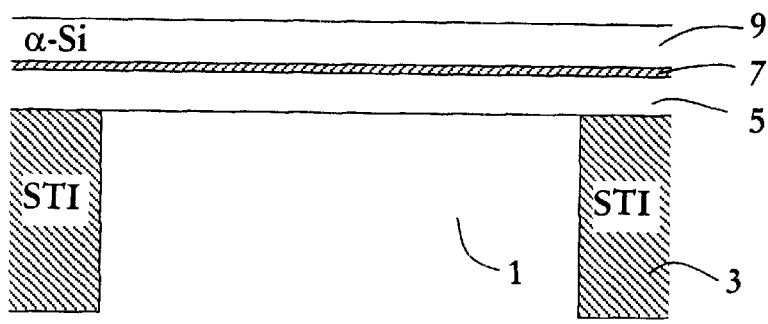
Figure 5:
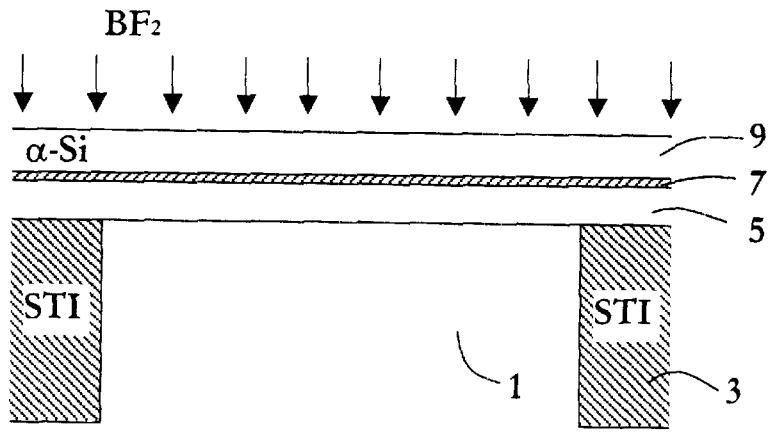
Figure 6:
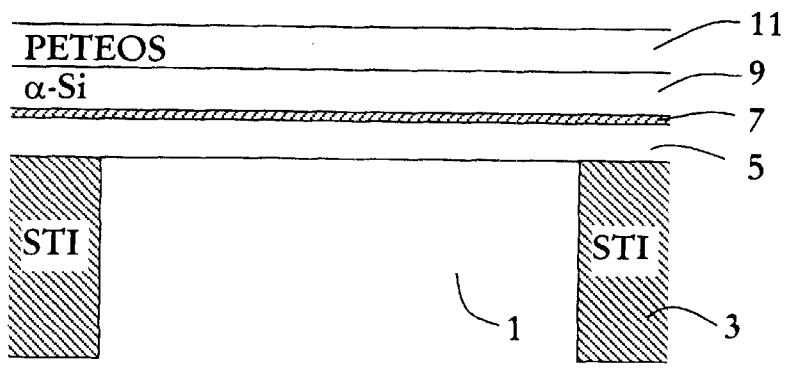
Figure 7:
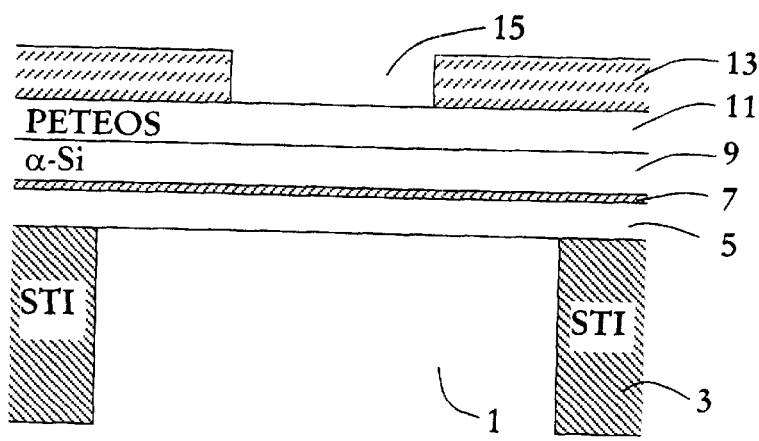
Figure 8:
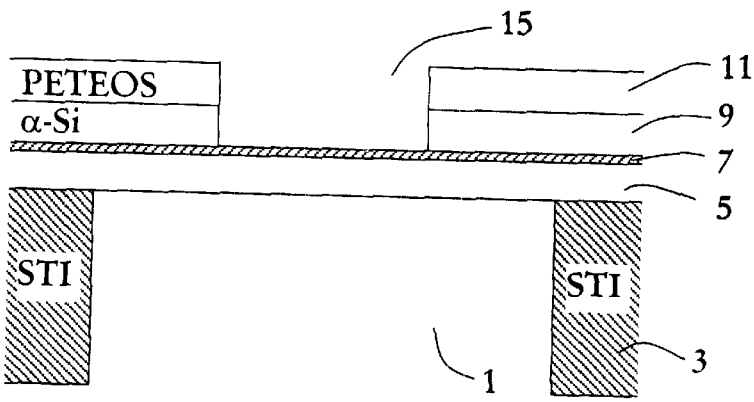
Figure 9:
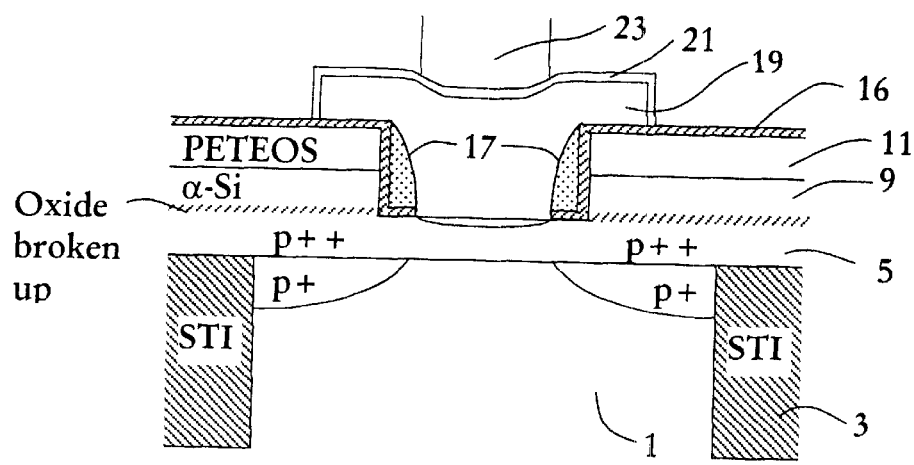

The invention relates to silicon bipolar transistors, especially low-voltage high-frequency transistors for use in mobile telecommunications, and particularly it relates to a method in the fabrication of such transistors.

TECHNICAL BACKGROUND

The Problem Area

Bipolar integrated circuits play a major role for modern telecommunication systems. The circuits are used mostly for analog functions, e.g. for switching currents and voltages, and for high-frequency radio functions (mixers, amplifiers, detector etc.).

To achieve good high-frequency properties of the transistor, the base must be made very narrow. Several problems from the physics and practical point of view arise. The doping of the base must be carefully tuned to give a reasonable beta, not too high doping in the emitter-base junctions (low $BV_{ebo}$ will follow otherwise), enough doping to withstand voltage applied over the base without going into "punch-through" breakdown, the Early voltage should be high, base resistance should be low, etc.

An important feature of high-frequency high-performance bipolar transistors is the emitter-base region. A polysilicon emitter improves the current gain and reduces the emitter charge storage time, and a narrow base reduces the base transit time and thus improves the high-frequency properties of the device. The base is usually formed by ion implantation of boron. The preferred shape of a thin base doping is a box, but with ion implantation, a smooth, almost half-triangular shape is usually obtained. A solution to this problem is to epitaxially deposit an in-situ doped base layer, thus obtaining a box profile structure. An extension of this is the epitaxially grown SiGe-transistor, where 10–30% Ge is added into the base to create heterojunction devices, that may improve the high-frequency properties and the current gain of the device.

To obtain transistors well suited e.g. for telecommunication applications, not only a low transit time (high $f_T$) is needed, but also a high maximum oscillation frequency ($f_{max}$) is required. To do this, the transistor must also have low collector-base capacitance and low base resistance. The base resistance consists of intrinsic and extrinsic base resistance and contact resistance.

Bipolar high-frequency transistors usually utilizes a self-registered base-emitter structure described in T. H. Ning et al., "Self-aligned NPN bipolar transistors", IEDM Tech. Dig., pp. 823–824, 1980, in which the transistor cell can be made smaller than with other techniques. Furthermore, reduced base-collector capacitance and reduced base resistance are obtained when the extrinsic base is contact to the intrinsic base close to the emitter. Several variations of the concept are known.

In U.S. Pat. No. 5,266,504 by Blouse et al., a method is described for manufacturing a self-aligned bipolar transistor, where the base is epitaxially grown, a polysilicon layer for the extrinsic base deposited but removed over the intrinsic base (no details are given how etch selectivity was obtained), and the emitter is formed by deposition of an amorphous silicon layer followed by patterning and etching. The amorphous silicon is re-crystallized by Solid Phase Epitaxy (SPE), and thus a sharp and well-controlled emitter-base junction is achieved. The re-crystallization is made by a prolonged heating (4 to 8 hours).

In U.S. Pat. No. 5,593,905 by Johnson & Taylor, a method is described for manufacturing a self-aligned bipolar transistor, where a link layer is formed between the intrinsic and extrinsic base, consisting of a double-layer of doped oxide and nitride, which is then pattern to cover the intrinsic base area only. The polysilicon for the extrinsic base is then deposited and the emitter window opened in the polysilicon, using the double-layer as an etch stop. The layer is then removed by dry-etching, stopping at the substrate (the base), using an etch that is highly selective against silicon. This etch reduces the damages to the active area as would have been the case as if polysilicon would have been etched directly on top of silicon. However, the method requires an additional mask layer, compared to conventional processing.

Patent WO 9719465, by Norstrom, utilizes different properties of amorphous silicon and the silicon substrate to add doping to the extrinsic base in a controlled way, and to open the emitter window with better properties than obtained by conventional processing.

Problems of Known Solutions

A common problem when fabricating self-aligned double-polysilicon bipolar transistors using thin bases is how to form the extrinsic base region (thick, heavily-doped material) and the intrinsic base region (thin, precise doping profile) and how to integrate this with the formation of the emitter.

The main problem occurs when the emitter window is to be opened. This usually involves etching of a polycrystalline layer on the silicon substrate. The problem is how to stop the etching procedure so that the polycrystalline layer is fully removed without etching down into the substrate. The problem is further accentuated if a thin base region formed via e.g. epitaxy prior to polysilicon deposition and etching of the emitter windows. The polycrystalline layer is preferentially etched along different crystal orientations and grain boundaries, which gives etching residues (pillars), non-uniformities (facets) and uneven edges in the etched areas. Especially when etching the emitter window, the etching properties is a major concern, since etching into the substrate (the intrinsic base), the base may be damaged or the link region between intrinsic and extrinsic base may be made too thin, causing high base resistance or even unlinking the intrinsic base from the extrinsic base. Emitter pipes may also occur because of etching residues (pillars), which can cause emitter leakage currents.

Ion implantation into polycristalline materials is not an optimal choice if good doping profile control is required. Because of channeling of the implanted species in polycristalline material, it may be hard to precisely control the doping profile. Implanting into similar amorphous layers solves the problem.

A method where the silicon for extrinsic base contacts is removed in the emitter window without affecting the underlying base layer is therefore of need.

SUMMARY OF THE INVENTION

The object of the present invention is to provide a method of fabrication a semiconductor structure that avoids the problems mentioned above by utilizing a thin oxide as etch stop when opening the emitter window in a self-aligned silicon bipolar transistor.

This object among others is, according to one aspect of the invention, attained by a method for forming base regions and for opening an emitter window, comprising the steps of:

providing a silicon substrate with suitable device isolation;

forming a first base region in or on top of said substrate;

forming a thin layer of oxide on said first base region;

forming a layer of silicon on top of said thin oxide layer, said silicon layer is to be a second base region;

ion implanting said silicon layer;

forming a layer of a dielectric on top of said silicon layer, said dielectric is to isolate base and emitter regions of said transistor;

patterning the hereby obtained structure in order to define the emitter window;

etching the structure inside said defined emitter window area and through the dielectric and silicon layers, wherein the thin oxide layer is used as etch stop, thus forming the emitter window; and subsequently heat treating the structure and thus break up the oxide such that the first and second base regions will contact each other.

Conventional processing steps may finish the transistor.

SHORT DESCRIPTION OF THE DRAWINGS

The present invention will become more fully understood from the detailed description of embodiments of the present invention given hereinbelow and the accompanying FIGS. 1–9, which are given by way of illustration only, and thus are not limitative of the present invention.

FIGS. 1–9 display schematically in cross-sections a semiconductor structure during various processing steps according to the present invention.

DESCRIPTION OF PREFERRED EMBODIMENTS

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

In this section, the process sequence, which includes formation of epitaxial base, extrinsic base and emitter window is described.

1. FIG. 1 shows a silicon substrate 1, which preferably is monocrystalline. The substrate can be homogeneous, but usually has different defined regions. In FIG. 1, the active area is depicted by (a), and isolation regions by (b). The substrate of the active area will form the collector of the device, and will be n-doped for NPN devices, using As, P or Sb. The shown device isolation is a 4500 Å thick shallow trench isolation (STI) 3 of $SiO_2$, but other standard methods, such a LOCOS, may also be used. Isolation may also consist of additional deep trench isolation. At this point, the substrate may be cleaned by HF to ensure a clean silicon surface in the exposed areas.

2. On the substrate, the epitaxial base 5 is deposited, see FIG. 2:. It may consist of highly doped silicon (p-type boron-doped for NPN transistors), but may also consists of a multi-structure of layers, such as Si/SiGe/Si with different dopants added. It may also be undoped (intrinsic, i) and subsequently ion implanted to form the base profile. On the exposed monocrystalline substrate areas, the deposited silicon will grow epitaxially, maintaining the crystal structure of the substrate. On other areas, the crystal structure may be amorphous or polycrystalline, depending on the underlying substrate and growth parameters. (Seed polysilicon layer on oxide may be needed.) The thickness is in the range of a few hundred, e.g. 200 to 1000 Å (typically it is about 800 Å). It is preferably deposited by Chemical Vapor Deposition (CVD) Epitaxy at 500–700° C., but may be deposited by other methods such as Molecular Beam Epitaxy (MBE) etc.

3. On top of the deposited silicon layer 5, a thin (preferably 10–50 Å (most preferred 25 Å)) silicon dioxide 7 is formed, preferably by thermal oxidation, which can be made using Rapid Thermal Oxidation (RTO) or furnace oxidation at low temperature, see FIG. 3. The purpose of this layer is to serve as an etch stop later in the flow, which will be explained below.

4. Next, 400–800 Å (typically 600 Å) amorphous silicon ($\alpha$-Si) 9 is deposited by CVD, see FIG. 4. However, other techniques for the depositing may be used such as e.g. PECVD or sputtering. By selecting the deposition temperature below 575° C., an amorphous layer will form. The advantages with using amorphous silicon have been discussed in the introduction.

5. The $\alpha$-Si is then doped by an ion implantation (preferably B or $BF_2$ for NPN transistors). The ion implantation is schematically indicated by arrows in FIG. 5. The energy is selected so that all of the boron ions will be contained within the $\alpha$-Si. At subsequent heat treatments (see point 9) in the conventional process flow, needed to activate dopants (e.g. emitter drive), the oxide will break up and the two silicon layer will contact each other and form a thick, highly doped silicon layer for the extrinsic base.

6. The structure is then covered by a layer (thickness of 500–2000 Å (typically 1000 Å)) of deposited low-temperature oxide (PETEOS) 11, deposited at a temperature low enough not to recrystallize the $\alpha$-Si, see FIG. 6. The purpose of this layer is to isolate the emitter polysilicon from the base poly.

7. A photomask 13 is applied in a common way and patterned to form an emitter window opening 15 over the center of the structure, see FIG. 7.

8. The PETEOS and $\alpha$-Si is then anisotropically etched, see FIG. 8. The thin oxide layer 7 will now serve as an end-point detection and etch-stop and when reached, the etch is disrupted. The photo resist is removed. The remains of the thin oxide can be removed prior to any further processing. However, conventional processing may continue with the formation of oxide/nitride layers for formation of sidewall spacers, and in such a case, the thin oxide does not need to be removed.

9. The obtained structure is then finished in a conventional process flow, see FIG. 9. Deposition/growing of $SiO_2$ 16, inside spacer (SiN sidewall spacer) 17 formation, deposition and doping and patterning of emitter polysilicon 19, additional implantation of extrinsic base, thermal activation, and silicide 21 and metal plug 23 formation (metallization).

Advantages of the Present Invention

Extrinsic/intrinsic base structure for bipolar transistors is formed with low risk of affecting the existing base layer.

Thick and highly doped polysilicon layers are created on extrinsic base regions.

Amorphous silicon is utilized to improve doping profile and etching control of extrinsic base layer.

No additional masks are used.

In summary, the present invention provides a method of fabrication a semiconductor structure that utilizes a thin oxide as etch stop when opening the emitter window in a self-aligned silicon bipolar transistor.

After formation of device isolation and deposition of intrinsic base, a thin oxide layer is deposited on the silicon used for intrinsic base before deposition of amorphous silicon for the extrinsic base. The structure is implanted by B or $BF_2$ with dose parameter selected so that the entire dose is located within the amorphous silicon layer. Thin oxide will break up at subsequent heat treatments. After PETEOS deposition, the oxide/amorphous silicon is etched in emitter openings, using the thin oxide as an etch stop. Conventional processing finishes the device.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. In the fabrication of a silicon bipolar transistor, a method for forming base regions and for opening an emitter window comprising the steps of:

providing a silicon substrate with suitable device isolation;

forming a first base region in or on top of said substrate;

forming a thin layer of oxide on said first base region;

forming a layer of silicon on top of said thin oxide layer, said silicon layer is to be a second base region;

forming a layer of a dielectric on top of said silicon layer, said dielectric is to isolate base and emitter regions of said transistor;

patterning the hereby obtained structure in order to define said emitter window;

etching said structure inside said defined emitter window area and through said dielectric and silicon layers, wherein said thin oxide layer is used as etch stop, thus forming said emitter window; and subsequently heat treating said structure and thus break up said oxide such that said first and second base regions will contact each other.

2. The method as claimed in claim 1 wherein said silicon layer is ion implanted prior to said formation of said dielectric layer.

3. The method as claimed in claim 1 wherein said substrate is monocrystalline.

4. The method as claimed in claim 1 wherein said suitable device isolation is shallow trench isolation (STI).

5. The method as claimed in claim 1 wherein said suitable device isolation is LOCOS isolation.

6. The method as claimed in claim 1 wherein said first base region is formed in said substrate by suitable doping.

7. The method as claimed in claim 1 wherein said first base region is formed.

8. The method as claimed in claim 1 wherein said first base region is formed on said substrate by a suitably doped multi-layer structure.

9. The method as claimed in claim 7 wherein said substrate is cleaned by HF prior to said formation of said first base region.

10. The method as claimed in claim 7 wherein said first base region is formed by deposition using CVD epitaxy or Molecular Beam Epitaxy (MBE).

11. The method as claimed in claim 1 wherein said first base region is formed to a thickness of 200–1000 Å.

12. The method as claimed in claim 1 wherein said thin oxide layer is formed by thermal oxidation of silicon.

13. The method as claimed in claim 1 wherein said thin oxide layer is formed to a thickness of 10–50 Å.

14. The method as claimed in claim 1 wherein said silicon layer on top of said oxide layer is formed as an amorphous silicon (α-Si) layer.

15. The method as claimed in claim 1 wherein said silicon layer on top of said oxide layer is formed by using CVD, PECVD or sputtering.

16. The method as claimed in claim 1 wherein said silicon layer on top of said oxide layer is formed to a thickness of 400–800 Å.

17. The method as claimed in claim 1 wherein said silicon layer on top of said oxide layer is ion implanted using an energy such that all ions will be contained within said silicon layer.

18. The method as claimed in claim 17 wherein said transistor to be manufactured is of npn type and said ions are B or $BF_2$ ions.

19. The method as claimed in claim 14 wherein said dielectric layer is formed at a temperature low enough not to recrystallize said amorphous silicon (α-Si) layer.

20. The method as claimed in claim 1 wherein said dielectric layer is a deposited low temperature oxide, PETEOS.

21. The method as claimed in claim 1 wherein said dielectric layer is formed to a thickness of 500–2000 Å.

22. The method as claimed in claim 1 wherein said structure inside said defined emitter window area is etched by an anisotropic etch.

23. The method as claimed in claim 1 wherein said structure inside said defined emitter window area is etched by using said thin oxide layer as an end-point detection.

24. The method as claimed claim 1 wherein said thin oxide layer inside said defined emitter window area is removed subsequent to said etching.

25. The method as claimed in claim 1 wherein following conventional processing steps for finishing said fabrication of said transistor is included: inside spacer formation, deposition, doping and patterning of emitter polysilicon, additional implantation of said second base region, thermal activation and metalization.

26. The method of claim 6, wherein said suitable doping is ion implantation.

27. The method of claim 7, wherein said first base region is formed on said substrate epitaxially.

28. The method of claim 8, wherein said suitably doped multi-layer structure is an Si/SiGeSi-structure.

29. The method of claim 12, wherein said thin oxide layer is formed by thermal oxidation of silicon using RTO or low temperature furnace oxidation.

* * * * *